US009173329B2

(12) United States Patent
Joo et al.

(10) Patent No.: US 9,173,329 B2
(45) Date of Patent: Oct. 27, 2015

(54) HEAT SINK-INTEGRATED DOUBLE-SIDED COOLED POWER MODULE

(71) Applicant: Hyundai Motor Company, Seoul (KR)

(72) Inventors: Jung Hong Joo, Gyeonggi-do (KR); Ki Young Jang, Gyeonggi-do (KR); Woo Yong Jeon, Seoul (KR); Sang Cheol Shin, Gyeonggi-do (KR)

(73) Assignee: Hyundai Motor Company, Seoul (KR)

(*) Notice: Subject to any disclaimer, the term of this patent is extended or adjusted under 35 U.S.C. 154(b) by 274 days.

(21) Appl. No.: 13/856,019

(22) Filed: Apr. 3, 2013

(65) Prior Publication Data

US 2014/0185243 A1 Jul. 3, 2014

(30) Foreign Application Priority Data

Dec. 27, 2012 (KR) ........................ 10-2012-0154214

(51) Int. Cl.
*H05K 7/20* (2006.01)
*H01L 23/473* (2006.01)
(Continued)

(52) U.S. Cl.
CPC ........ *H05K 7/20927* (2013.01); *H01L 23/3735* (2013.01); *H01L 23/4334* (2013.01);
(Continued)

(58) Field of Classification Search
CPC ................. H01L 2924/13055; H01L 23/4334; H01L 23/3735; H01L 23/473; H01L 2924/1305; H01L 2224/33181; H01L 24/29; H01L 2224/06181; H01L 2224/32225; H01L 25/115; H01L 2224/04026; H01L 24/32; H01L 23/3107; H01L 24/06; H01L 24/33; H05K 7/20927; H05K 7/209
USPC ........... 361/679.46–679.54, 688–723; 165/43
See application file for complete search history.

(56) References Cited

U.S. PATENT DOCUMENTS

2010/0038058 A1* 2/2010 Gunturi et al. ............... 165/80.4
2010/0230800 A1* 9/2010 Beaupre et al. ............... 257/691
(Continued)

FOREIGN PATENT DOCUMENTS

JP 2002315357 A 10/2002
JP 2005-011922 A 1/2005
(Continued)

OTHER PUBLICATIONS

"Design for Manufacturability Of Forced Convection Air Cooled Fully Ducted Heat Sinks"—Electronics Cooling Magazine—Aug. 2007 http://www.electronics-cooling.com/2007/08/design-for-manufacturability-of-forced-convection-air-cooled-fully-ducted-heat-sinks/.*

*Primary Examiner* — Anthony Haughton
*Assistant Examiner* — Yahya Ahmad
(74) *Attorney, Agent, or Firm* — Mintz Levin Cohn Ferris Glovsky and Popeo, P.C.; Peter F. Corless

(57) ABSTRACT

A power module for an inverter that is used in an eco-friendly vehicle, such as a hybrid vehicle, an electrical vehicle, or a fuel cell vehicle, i.e., a heat sink-integrated double-sided cooled power module in which cooling efficiency is maximized by adopting a double-sided direct cooling method that uses a heat sink manufactured by an extrusion method. In particular, the heat sink is disposed in upper and lower portions of the power module, and direct bonding materials (DBMs) are deposited between the upper and lower heat sinks where a chip is interposed between the DBMs. Faces between the heat sinks, the chip, and the DBMs are bonded to one another by a solder, and an entire circumference of the chip and the DBMs is finished by a mold portion.

5 Claims, 6 Drawing Sheets

[C-C CROSS-SECTION]

(51) Int. Cl.

| | |
|---|---|
| ***H01L 23/373*** | (2006.01) |
| ***H01L 23/433*** | (2006.01) |
| *H01L 23/31* | (2006.01) |
| *H01L 23/00* | (2006.01) |
| *H01L 25/11* | (2006.01) |

(52) U.S. Cl.

CPC ........... *H01L23/473* (2013.01); *H01L 23/3107* (2013.01); *H01L 24/06* (2013.01); *H01L 24/29* (2013.01); *H01L 24/32* (2013.01); *H01L 24/33* (2013.01); *H01L 25/115* (2013.01); *H01L 2224/04026* (2013.01); *H01L 2224/06181* (2013.01); *H01L 2224/291* (2013.01); *H01L 2224/32225* (2013.01); *H01L 2224/33181* (2013.01); *H01L 2924/1305* (2013.01); *H01L 2924/13055* (2013.01)

(56) References Cited

U.S. PATENT DOCUMENTS

2012/0314372 A1* 12/2012 Hauenstein .................. 361/715
2013/0020694 A1* 1/2013 Liang et al. .................. 257/691

FOREIGN PATENT DOCUMENTS

| | | | |
|---|---|---|---|
| JP | 2005057102 | A | 3/2005 |
| JP | 2005123233 | A | 5/2005 |
| JP | 2006140217 | A | 6/2006 |
| JP | 2008124430 | A | 5/2008 |
| JP | 2009177038 | A | 8/2009 |
| JP | 2010010504 | A | 1/2010 |
| JP | 2010080782 | A | 4/2010 |
| WO | 2009/066692 | A1 | 5/2009 |

* cited by examiner

[A-A CROSS-SECTION]

[B-B CROSS-SECTION]

[D-D CROSS-SECTION]

HEAT SINK-INTEGRATED DOUBLE-SIDED COOLED POWER MODULE

CROSS-REFERENCE TO RELATED PATENT APPLICATION

This application claims the benefit of Korean Patent Application No. 10-2012-0154214, filed on Dec. 27, 2012 in the Korean Intellectual Property Office, the disclosure of which is incorporated herein in its entirety by reference.

BACKGROUND

1. Field of the Invention

The present invention relates to a heat sink-integrated double-sided cooled power module, and more particularly, to a power module for an inverter that is used in an eco-friendly vehicle, such as a hybrid vehicle, an electrical vehicle, or a fuel cell vehicle.

2. Description of the Related Art

In general, a permanent magnet type motor is used as a driving mechanism in an electrical vehicle, a hybrid vehicle, or a fuel cell vehicle. The motor is typically driven by a phase current that is transmitted by an inverter that transforms a direct current (DC) voltage into a three-phase voltage due to a pulse width modulation (PWM) signal of a controller, via a power cable.

A power module that supplies power for driving the motor by receiving DC power from a battery, is combined with the inverter. The power module generally has a shape in which six or three phases are integrated as one package. Heat is generated in such a power module as a result of supplying power. Thus, various units for cooling heat generated in the power module are used for a stable operation of the power module. For example, a heat sink for reducing heat generated in an insulated-gate bipolar transistor (IGBT) and a diode chip when a switching operation is performed, is typically used in the power module. [NOTE: We would recommend including these in an IDS rather than the background.]

FIG. 1 is a cross-sectional view of a single-sided direct cooled power module according to the related art. As illustrated in FIG. 1, a case type single-sided direct cooling method is used in cooling the power module, and the power module is disposed on an integrated blazing heat sink. Here, reference numerals 100, 110, 120, and 130 represent a chip, a direct bonding material (DBM), a heat sink, and a solder, respectively.

Direct bonding copper (DBC) or direct bonding aluminum (DBA) is usually used as the DBM. However, in the power module illustrated in FIG. 1, it is difficult to manufacture the integrated blazing heat sink, and high manufacturing costs are required, and it is difficult to manage a plan view of the heat sink, however. Also, cooling efficiency of the power module is lowered compared to double-sided cooling.

FIG. 2 is a cross-sectional view of a double-sided indirect cooled power module according to the related art. As illustrated in FIG. 2, a double-sided indirect cooling method is used in cooling the power module, and thermal grease is applied onto both sides of the power module and then ceramics are attached to the power module so that both sides of the power module can be cooled by a heat sink. Here, reference numerals 100, 120, 130, 140, 150, 160, and 170 represent a chip, a heat sink, a solder, thermal grease, ceramics, a heat spreader, and a mold, respectively.

However, in the power module illustrated in FIG. 2, it is difficult to dispose both sides of each of several power modules parallel to each other so as to cool the power module by using the heat sink. Also, since the power module, the ceramics, and the heat sink are separate elements, it is difficult to create an inverter that combines the elements, since assembling thereof is complicated and thus, management and manufacturing thereof is difficult. Also, since the indirect cooling method is used in cooling the power module of FIG. 2, cooling efficiency is lowered compared to double-sided direct cooling.

FIG. 3 is a cross-sectional view of a double-sided direct cooled power module according to the related art. As illustrated in FIG. 3, a mold type double-sided direct cooling method is used in cooling the power module, and an insulation sheet is attached to both sides of the power module so that the power module can be fixed to a box type heat sink. Here, reference numerals 100, 120, 130, 160, 170, and 180 represent a chip, a heat sink, a solder, a heat spreader, a mold, and an insulation sheet, respectively.

However, in the power module of FIG. 3, the box type heat sink is combined with the power module by attaching the insulation sheet to the power module. In this case, cooling efficiency is lowered due to the insulation sheet. Also, when the insulation sheet is forcibly attached to the power module, the insulation sheet may become detached from the power module. In this case, a problem relating to insulation may occur.

SUMMARY OF THE INVENTION

The present invention provides a heat sink-integrated double-sided cooled power module in which cooling efficiency may be maximized by adopting a double-sided direct cooling method that uses a heat sink manufactured by an extrusion method and inverter manufacturing cost may be reduced by making a simple structure for an inverter.

The present invention also provides a heat sink-integrated double-sided cooled power module in which an additional process due to a problems relating to management of a plan view of a heat sink may be omitted, as obtaining a plan view of all of the power modules by adopting a power module connector that connects and combines several power modules.

According to an aspect of the present invention, there is provided a heat sink-integrated double-sided cooled power module that is used in an inverter for a vehicle, including: heat sinks disposed in upper and lower portions of the power module; and direct bonding materials (DBMs) that are deposited between the upper and lower heat sinks in a state where a chip is interposed between the DBMs, wherein faces between the heat sinks, the chip, and the DBMs are bonded to one another by a solder, and an entire circumference of the chip and the DBMs is finished by a mold portion.

The heat sinks may be manufactured by an extrusion method and may include a plurality of apertures through which cooling water flows and which are formed in the heat sinks. For example, the heat sinks may be formed as a rectangular case having a structure in which both facing cross-sections of the heat sinks communicate with each other in one direction, and a plurality of barrier walls may be formed in the case and may be parallel to one another along a direction in which both facing cross-sections of the heat sinks communicate with each other, and a space between the plurality of barrier walls may be formed by the plurality of apertures.

Several modules including the mold portion and the upper and lower heat sinks may be connected to one another by a module connector. The module connector in this case may include a connector body that communicates with insides of the heat sinks and simultaneously accommodates ends of the adjacent heat sinks, latches that are caught in or released from a groove formed in the heat sinks, and latch moving portions that operate actions of the latches.

Also, a gasket may be installed at the connector body of the module connector along a circumference of a portion of the connector body that contacts the heat sinks to prevent leakage of cooling water.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully with reference to the accompanying drawings, in which exemplary embodiments of the invention are shown, so that one of ordinary skill in the art can easily embody the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Figure 1:
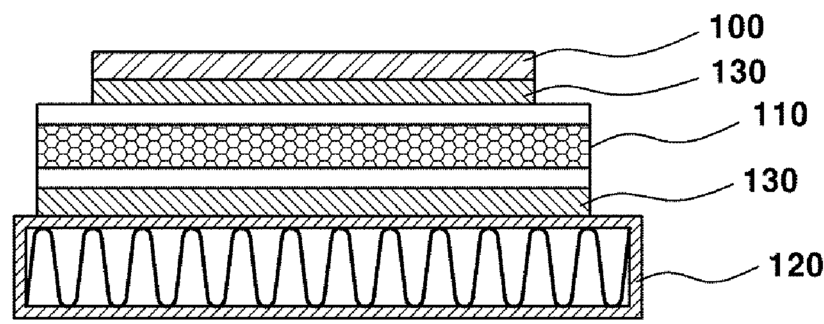
FIG. 1 is a cross-sectional view of a single-sided direct cooled power module according to the related art.
Figure 2:
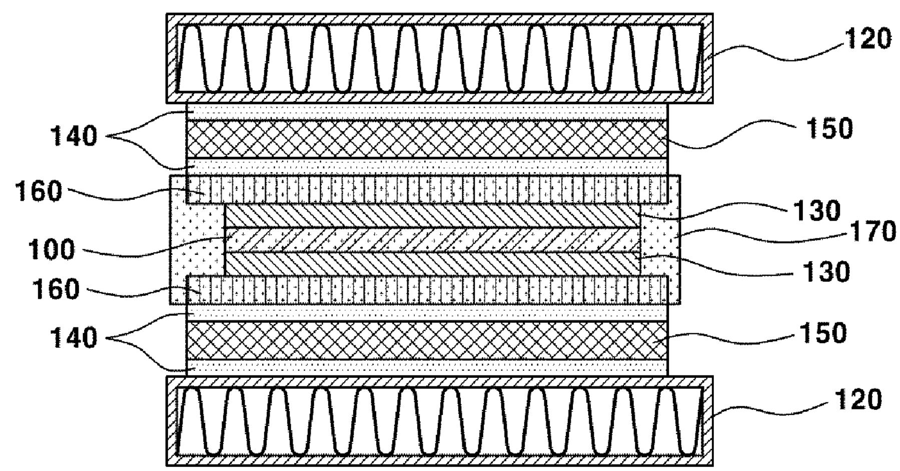
FIG. 2 is a cross-sectional view of a double-sided indirect cooled power module according to the related art.
Figure 3:
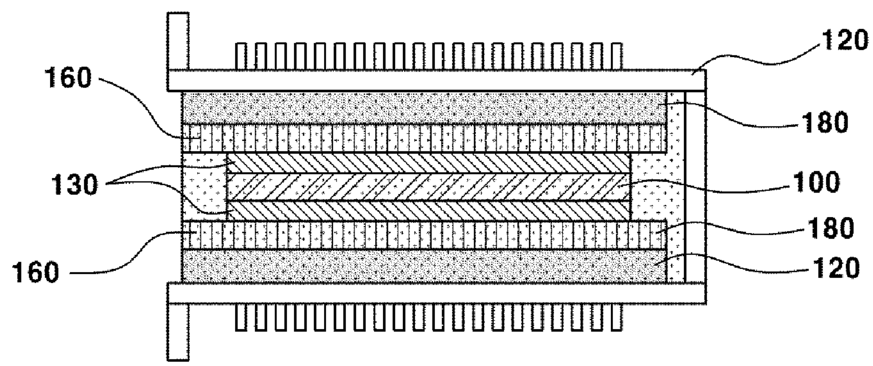
FIG. 3 is a cross-sectional view of a double-sided direct cooled power module according to the related art.
Figure 4:
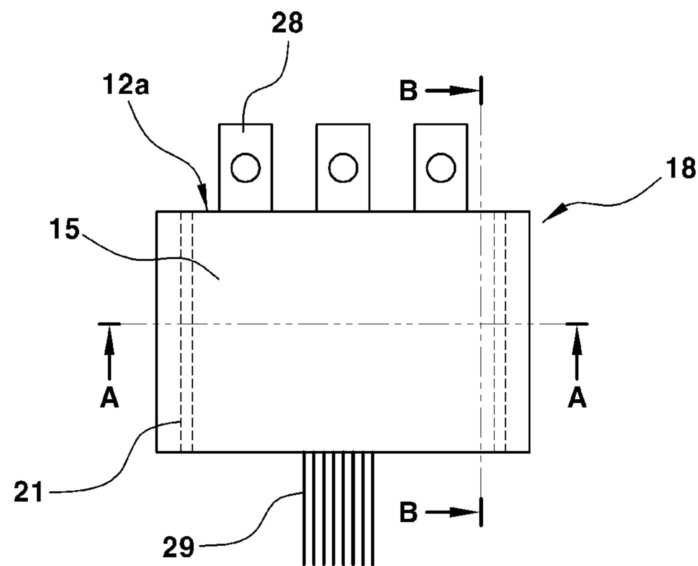
FIG. 4 is a plan view of a heat sink-integrated double-sided cooled power module according to an embodiment of the present invention.
Figure 5:
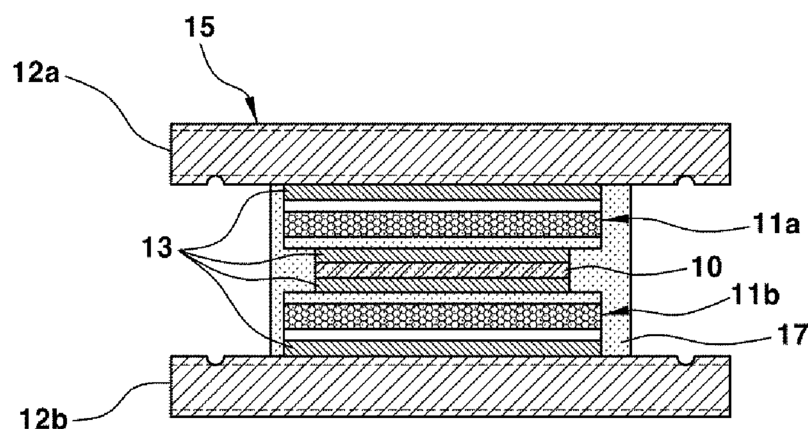
FIG. 5 is a cross-sectional view taken along line A-A of FIG. 4.
Figure 6:
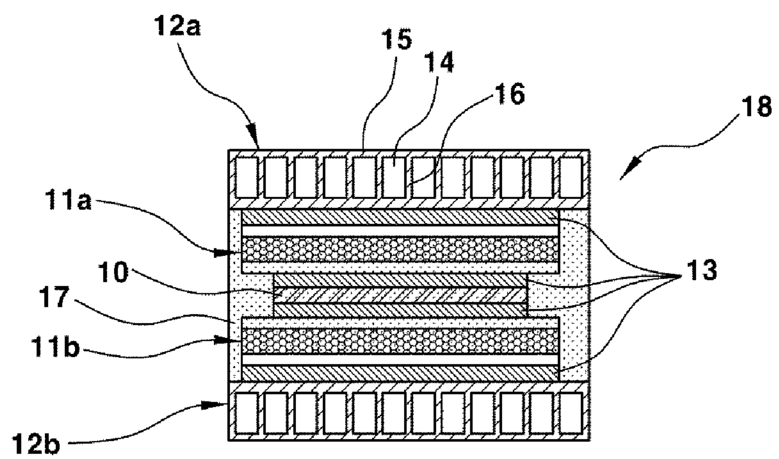
FIG. 6 is a cross-sectional view taken along line B-B of FIG. 4.

FIGS. 4 through 6 are a plan view and cross-sectional views of a heat sink-integrated double-sided cooled power module according to an exemplary embodiment of the present invention. As illustrated in FIGS. 4 through 6, according to the present invention, a way to integrate a heat sink with a power module and to connect the heat sink to the power module is improved so that a light-weight, low-price and high reliability power module can be realized.

To this end, heat sinks 12*a* and 12*b* are disposed in upper and lower portions of a module 18, and direct bonding materials (DBMs) 11*a* and 11*b* are deposited between the upper and lower heat sinks 12*a* and 12*b* when a chip 10 is interposed between the DBMs 11*a* and 11*b* so that the chip 10 and the DBMs 11*a* and 11*b* are bonded to each other by a solder 13 and the entire circumference of the bonded chip 10 and DBMs 11*a* and 11*b* is molded by a mold portion 17 and is finished.

In this case, faces between inner sides of the heat sinks 12*a* and 12*b* and the DBMs 11*a* and 11*b* are also bonded to one another by the solder 13. Thus, the module 18 in which the mold portion 17 including the chip 10 and the DBMs 11*a* and 11*b* and the upper and lower heat sinks 12*a* and 12*b* are formed as one body, is completed. Here, the chip 10 is a semiconductor chip including an insulated-gate bipolar transistor (IGBT) and a diode, and the solder 13 bonds the chip 10 and the DBMs 11*a* and 11*b* to each other and simultaneously bonds the DBMs 11*a* and 11*b*.

The mold portion 17 is a portion for molding the whole of the module 18 by using resin. The chip 10 may be sealed by the mold portion 17 so that the reliability of the module 18 can be improved. In particular, the heat sinks 12*a* and 12*b* are manufactured using an extrusion method, and a plurality of apertures 14 through which cooling water may flow, is formed in a case 15 formed of aluminum.

For example, the heat sinks 12*a* and 12*b* may be formed as the rectangular case 15 having a structure in which both facing cross-sections of the heat sinks 12*a* and 12*b* communicate with each other in one direction. A plurality of barrier walls 16 are formed in the case 15 and are parallel to one another along a direction in which both facing cross-sections of the heat sinks 12*a* and 12*b* communicate with each other, (vertical direction) and simultaneously is maintained at regular intervals along a horizontal direction. In this case, an interval between the plurality of barrier walls 16 is at a minimum at which extrusion may be performed, so that heat-dissipation performance may be maximized. Thus, a space between the barrier walls 16 formed in the case 15 may be naturally formed by the plurality of apertures 14 through which cooling water may flow. Of course, the cross-sectional shape of the apertures 14 may be circular or oval shape, in addition to the rectangular shape.

Also, a groove 21 is formed in an inner position of a portion that extends to both sides of the mold portion 17, of the heat sinks 12*a* and 12*b* of the module 18. The groove 21 in this case may be used when a protrusion 27 on a latch 22 of a module connector 19 that will be described below is caught in the groove 21.

A high-voltage terminal 28 and a signal terminal 29 are disposed on the module 18. The high-voltage terminal 28 in this case is a high-voltage terminal of the power module and includes high-voltage positive and negative output terminals. Also, the signal terminal 29 includes a gate signal for driving the power module and temperature and current sensors.

Figure 7:
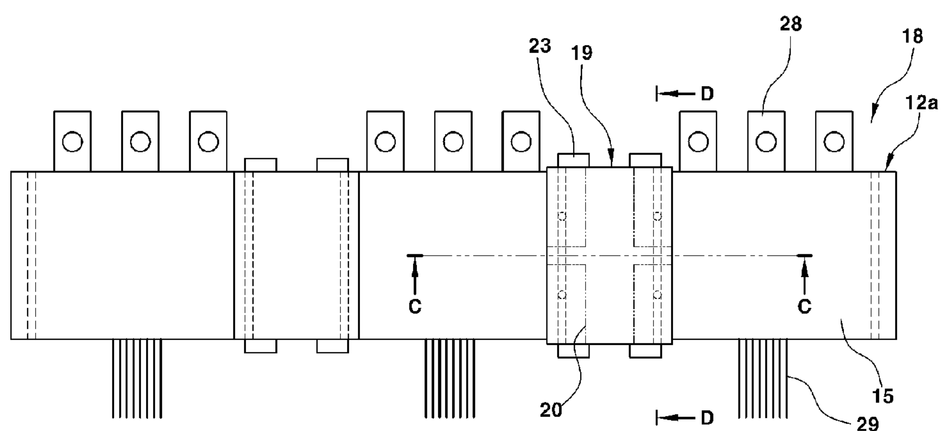
FIG. 7 is a plan view illustrating a state where several heat sink-integrated double-sided cooled power modules are connected to one another, according to an embodiment of the present invention.
Figure 8:
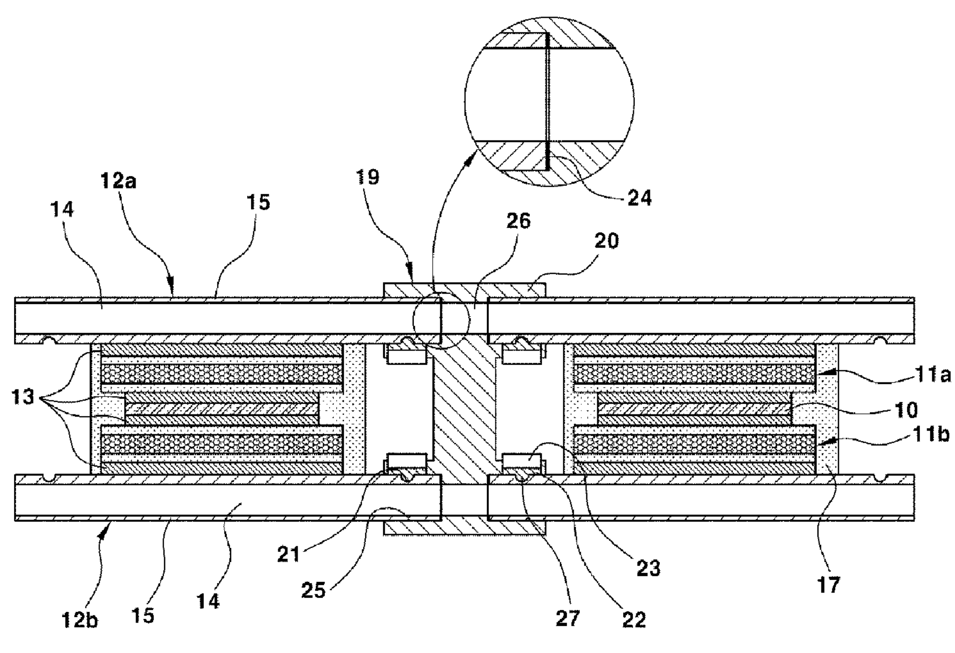
FIG. 8 is a cross-sectional view taken along line C-C of FIG. 7.
Figure 9:
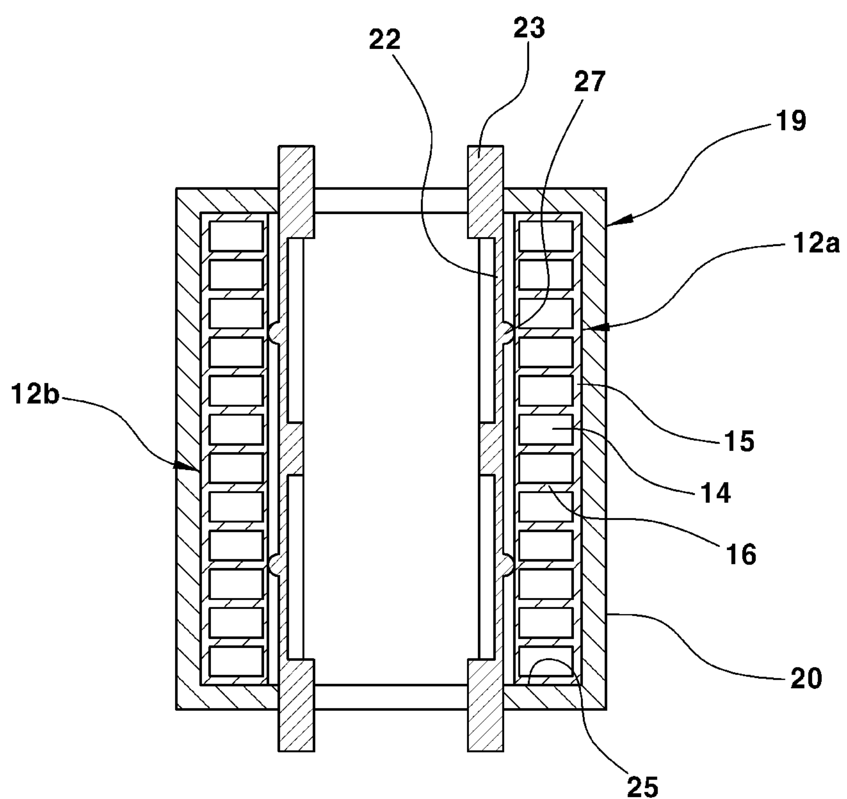
FIG. 9 is a cross-sectional view taken along line D-D of FIG. 7.

FIGS. 7 through 9 are a plan view and cross-sectional view illustrating a state where several heat sink-integrated double-sided cooled power modules are connected to one another, according to an exemplary embodiment of the present invention. As illustrated in FIGS. 7 through 9, several modules 18 including the mold portion 17 and the heat sinks 12*a* and 12*b* are connected in a line by using the module connector 19.

To this end, the module connector 19 includes a connector body 20 that has module accommodation grooves 25 in which ends of the heat sinks 12*a* and 12*b* of each module 18 may be accommodated and which are formed in both sides of the connector body 20, and the latches 22 and latch moving portions 23 that are operational portions for locking and releasing the connection state of the module connector 19 of the modules 18.

A cooling water path 26 through which cooling water may flow, is formed in the connector body 20, in a portion that connects both module accommodation grooves 25. The cooling water path 26 in this case communicates with the apertures 14 inside the heat sinks 12*a* and 12*b* when the heat sinks 12*a* and 12*b* contact both sides of the module connector 19. Thus, cooling water that flows through the apertures 14 of one of the heat sinks 12*a* and 12*b* is sent to the apertures 14 of the other one of the heat sinks 12*a* and 12*b* via the cooling water path 26 of the connector body 20 and may flow continuously through the apertures 14 of the other one of the heat sinks 12*a* and 12*b*.

In particular, a gasket 24 may be installed at the connector body 20 along a circumference of a portion of the connector body 20 that contacts the heat sinks 12*a* and 12*b*. Thus, cooling water may be prevented from leaking from a portion in which the connector body 20 and the heat sinks 12*a* and 12*b* are connected to each other. Each latch 22 and each latch moving portion 23 that is an operational portion integrated with ends of the latches 22 are disposed as portions for connecting and releasing the module connector 19 and the modules 18.

According to the present invention, a total of four pairs of latches 22 and latch moving portions 23 may be disposed on both sides of the module connector 19, i.e., by one pair in forward and backward directions of both sides of the module connector 19. The latch 22 is a band-shaped member, and one end of the latch 22 is connected to the connector body 20 and the other end of the latch 22 in which the latch moving portion 23 is disposed, is a free end so that the latch 22 may be elastically leaned backward or restored.

The protrusion 27 is formed on the latch 22. The protrusion 27 in this case is caught in or fallen out from the groove 21 in the module 18, i.e., the groove 21 inside of the heat sinks 12*a* and 12*b* so that the module connector 19 and the module can be connected to each other as one body and the module 18 can also be separated from the module connector 19. For example, when ends of the heat sinks 12*a* and 12*b* of the module 18 are inserted in the module accommodation grooves 25 of the module connector 19, the protrusion 27 of the latch 22 is leaned backward due to contact with the ends of the heat sinks 12*a* and 12*b*, is again restored and is caught in the groove 21 so that the module 18 can be connected to the module connector 19.

In addition, when the module 18 is separated from the module connector 19, by grasping both facing latch moving portions 23 in a vertical direction with a finger and by pressurizing and pursing them, the latch 22 is elastically leaned backward and the protrusion 27 falls out from the groove 21 so that the module 18 can be easily separated from the module connector 19. Thus, several modules 18 are connected by a plurality of module connectors 19 so that the flow path of cooling water that flows through each module and each module connector can be obtained. Also, modules that are parallel to one another in a line by using module connectors and are systematically connected to one another and are maintained in the same plane so that an additional process for managing the plan view of all of power modules when the power modules are connected according to the related art can be omitted.

As described above, a heat sink-integrated double-sided cooled power module according to an exemplary embodiment of the present invention has the following advantages.

Cost Reduction

According to the present invention, the heat sink-integrated double-sided cooled power module is manufactured by using an extrusion method so that a pin-fin heat sink fabrication process for direct cooling can be omitted and cost for manufacturing a heat sink can be reduced by 50% or more compared to the related art.

According to the present invention, cooling efficiency is improved so that the size of a semiconductor chip compared to existing indirect single-sided cooling can be reduced by at least half and costs for manufacturing a power module can be reduced by 20% or more. According to the present invention, the complexity of a structure of combining several power modules compared to a double-sided indirect cooled power module can be removed so that cost for manufacturing an inverter can be greatly reduced.

Performance Improvement

According to the present invention, double-sided direct cooling improves cooling efficiency by 60% or more compared to existing single-sided indirect cooling and by 20% or more compared to double-sided indirect cooling and twice or more output compared to the related art can be increased by improving cooling performance.

Marketability Improvement

According to the present invention, the entire size of the inverter is reduced by reducing the size of the power module so that the flexibility of a vehicle package can be obtained and marketability of an engine room can be greatly improved.

According to the present invention, a heat sink (cooling module) is integrated with the power module so that an additional die casting cooling channel is unnecessary for cooling of the power module. Thus, the inverter can be easily manufactured, and processes including coating thermal grease and attaching an insulation sheet, can be omitted when a mold module is assembled so that a process of manufacturing the inverter can be simplified.

When several mold modules are simultaneously attached to the heat sink, a plan view of the cooling module should be managed so as to improve cooling efficiency. An additional process is required to manage a plan view of a double-sided module according to the related art. However, according to the present invention, a scheme for directly combining the heat sink with both sides of the mold module is suggested so that the additional process due to a problem relating to management of the plan view can be omitted.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A heat sink-integrated double-sided cooled power module that is used in an inverter for a vehicle, comprising:

heat sinks disposed in upper and lower portions of the power module; and direct bonding materials (DBMs) that are deposited between the upper and lower heat sinks where a chip is interposed between the DBMs, wherein faces between the heat sinks, the chip, and the DBMs are bonded to one another by a solder, and an entire circumference of the chip and the DBMs is finished by a mold portion, wherein the heat sinks comprise a plurality of apertures through which cooling water flows and which are formed in the heat sinks, wherein several power modules comprising the mold portion and the upper and lower heat sinks are connected to one another by a module connector, and wherein the module connector comprises a cooling water path through which cooling water flows and which communicates with the plurality of apertures inside the heat sinks in a state where the heat sinks contact both sides of the module connector.

2. The heat sink-integrated double-sided cooled power module of claim 1, wherein the heat sinks are manufactured by an extrusion method.

3. The heat sink-integrated double-sided cooled power module of claim 2, wherein the heat sinks are formed as a rectangular case having a structure in which both facing cross-sections of the heat sinks communicate with each other in one direction, and a plurality of barrier walls are formed in the case and are parallel to one another along a direction in which both facing cross-sections of the heat sinks communicate with each other, and a space between the plurality of barrier walls is formed by the plurality of apertures.

4. The heat sink-integrated double-sided cooled power module of claim 1, wherein the module connector comprises a connector body that communicates with insides of the heat sinks and simultaneously accommodates ends of the adjacent heat sinks, latches that are caught in or released from a groove formed in the heat sinks, and latch moving portions that operate actions of the latches.

5. The heat sink-integrated double-sided cooled power module of claim 1, wherein a gasket is installed on the connector body of the module connector along a circumference of a portion of the connector body that contacts the heat sinks to prevent leakage of cooling water.

* * * * *